United States Patent
Ning (10) Patent No.: US 6,611,453 B2
(45) Date of Patent: Aug. 26, 2003

(54) SELF-ALIGNED CROSS-POINT MRAM DEVICE WITH ALUMINUM METALLIZATION LAYERS

(75) Inventor: Xian J. Ning, Mohegan Lake, NY (US)

(73) Assignee: Infineon Technologies AG, Munich (DE)

( * ) Notice: Subject to any disclaimer, the term of this patent is extended or adjusted under 35 U.S.C. 154(b) by 153 days.

(21) Appl. No.: 09/797,245

(22) Filed: Mar. 1, 2001

(65) Prior Publication Data

US 2002/0097600 A1 Jul. 25, 2002

Related U.S. Application Data (60) Provisional application No. 60/263,992, filed on Jan. 24, 2001.

(51) Int. Cl.$^7$ .............................................. G11C 11/14
(52) U.S. Cl. ........................ 365/171; 365/158; 365/173
(58) Field of Search ................................ 365/171, 158, 365/173

(56) References Cited

U.S. PATENT DOCUMENTS 5,946,228 A * 8/1999 Abraham et al. ............ 365/173
6,072,718 A * 6/2000 Abraham et al. ............ 365/173
6,166,948 A * 12/2000 Parkin et al. ................ 365/173

OTHER PUBLICATIONS

X.J. Ning, et al., Process Integration of 150 nm Aluminum RIE—How Much Smaller Can It Be?; Sep. 7–9, 1999 VMIC Conference; 1999 IMIC—109/99/0047(c).

G. Stojakovic and X.J. Ning, Reactive icon etch of 150 nm Al lines for interconnections in dynamic random access memory; J. Vac. Sci. Technol. A 18(4), Jul./Aug. 2000.

* cited by examiner

*Primary Examiner*—Michael S. Lebentritt
*Assistant Examiner*—Hien Nguyen
(74) *Attorney, Agent, or Firm*—Slater & Matsil, L.L.P.

(57) ABSTRACT

An MRAM device (160) and manufacturing process thereof having aluminum conductive lines (134) and (152), with self-aligning cross-points. Conductive lines (134) and metal stack (138) are patterned in a single patterning step and etched. Conductive lines (152) positioned orthogonally to conductive lines (134) are patterned simultaneously with the patterning of metal stack (138) and are etched. The metal stack (138) serves as an anti-reflective coating for conductive lines (152) during the etching process. A multi-level MRAM device may be manufactured in accordance with an embodiment of the invention.

11 Claims, 6 Drawing Sheets

SELF-ALIGNED CROSS-POINT MRAM DEVICE WITH ALUMINUM METALLIZATION LAYERS

This patent claims the benefit of U.S. Provisional patent application Ser. No. 60/263,992, filed Jan. 24, 2001, which is incorporated herein by reference.

TECHNICAL FIELD

The present invention relates generally to the fabrication of semiconductor devices, and more particularly to magnetic random access memory (MRAM) devices.

BACKGROUND OF THE INVENTION

Semiconductors are used for integrated circuits for electronic applications, including radios, televisions, and personal computing devices, as examples. One type of semiconductor device is a semiconductor storage device, such as a dynamic random access memory (DRAM) and flash memory, which use an electron charge to store information.

A more recent development in memory devices involves spin electrics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular Lo one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is stored in the alignment of magnetic moments. The resistance of the magnetic component depends on the moment's alignment. The stored state is read from the element by detecting the component's resistive state. A memory cell may be constructed by placing the conductive lines and cross-points in a matrix structure having rows and columns.

An advantage of MRAMs compared to traditional semiconductor memory devices such as DRAMs is that MRAMs can be made smaller and provide a non-volatile memory. For example, a personal computer (PC) utilizing MRAMs would not have a long "boot-up" time as with conventional PCs that utilize DRAMs. MRAMs permit the ability to have a memory with more memory bits on the chip than DRAMs or flash memories. Also, an MRAM does not need to be powered up and has the capability of remembering the stored data.

A disadvantage of manufacturing MRAMs is that copper is the preferred material for the conductive lines, due to the excellent conductive properties of copper compared to aluminum and other conventional metals used in semiconductor technology. Copper oxidizes easily, and additional processing steps are required in order to prevent oxidation. Furthermore, copper cannot be etched, and therefore, damascene processes must be used to form copper conductive lines. Misalignment is a frequent problem with damascene processes, which is particularly problematic in the manufacturing of MRAM devices.

What is needed in the art is an MRAM structure and processing flow method that alleviates the conductive line misalignment problem in prior art MRAM designs.

SUMMARY OF THE INVENTION

The present invention achieves technical advantages as an MRAM device having aluminum conductive lines. A process flow that integrates magnetic cross-point devices in an aluminum back-end-of-line (BEOL) without additional lithographic steps is disclosed herein. The process and structure is self-aligned and no additional lithographic masks are needed for a magnetic device application.

Disclosed is an MRAM device comprising a workpiece, a first dielectric layer disposed over the workpiece, and at least one first conductive line disposed over the first dielectric layer. A magnetic stack is disposed over the first conductive line and at least one second conductive line is disposed over the magnetic stack orthogonal to the first conductive line, and the magnetic stack resides between cross-points of the first and second conductive lines.

Also disclosed is a method of manufacturing an MRAM device, comprising providing a workpiece, depositing a first metallization layer over the workpiece. A magnetic stack is deposited over the first metallization layer, and the magnetic stack and first metallization layer are patterned and etched to form first conductive lines. A first dielectric layer is deposited over the magnetic stack and first conductive lines. A planarization, chemical mechanical polish (CMP), for example, process is performed to planarize the dielectric surface and expose the magnetic layer. A second metallization layer is deposited over the first dielectric layer. The second metallization layer and the magnetic stack are patterned and etched to form second conductive lines orthogonal to the first conductive lines, and leave portions of the magnetic stack between cross-points of the first and second conductive lines.

Advantages of the invention include providing a process flow for integrating magnetic cross-point devices in an aluminum BEOL with no additional lithographic steps. The process is self-aligning, which prevents shorts between metallization layers. No additional lithographic masks are needed for MRAM fabrication in accordance with the present invention. The use of copper as metallization layers is avoided with the present invention, so that damascene processes are not required. Aluminum can be etched directly, unlike copper which is unetchable. Thus, the formation of MRAM conductive lines is simplified and requires fewer processing steps.

BRIEF DESCRIPTION OF THE DRAWINGS

The above features of the present invention will be more clearly understood from consideration of the following descriptions in connection with accompanying drawings in which:

FIGS. 3a and 3b through FIGS. 10a and 10b illustrate a process for forming an MRAM IC in accordance with one embodiment of the present invention;

Corresponding numerals and symbols in the different figures refer to corresponding parts unless otherwise indicated. The figures are drawn to clearly illustrate the relevant aspects of the preferred embodiments, and are not necessarily drawn to scale. In the figures, the "a" figure represents a cross-sectional view of the MRAM device, and the "b" figure represents the same MRAM device in an orthogonal cross-sectional view from the "a" figure.

DETAILED DESCRIPTION OF PREFERRED EMBODIMENTS

Problems with prior art MRAM devices using copper as a conductive material will be discussed, followed by a description of preferred embodiments of the present invention and the advantages thereof. Approximately four MRAM cells are shown in each figure, although many MRAM cells and other conductive lines may be present within each layer.

Magnetic metal stacks are typically embedded in BEOL integrated circuits (ICs) to manufacturing MRAM devices. A magnetic stack comprises many different layers of metals with a thin layer of dielectric therebetween. The magnetic stack may have a total thickness of a few tens of nanometers, for example. For cross-point MRAM structures, the magnetic stack is located at the intersection of two metal wiring levels, for example, at the intersection of metal 2 (M2) and metal 3 (M3) layers that run in orthogonal directions perpendicular to one another. The magnetic stack is typically contacted at the bottom and top to the M2 and M3 wiring layer conductive lines, respectively.

As ground rules get smaller, the overlay of magnetic stacks over the M2 and M3 levels becomes more important, because any misalignment may cause an over etch in pattern transfer processes, which may result in line-to-line or level-to-level electrical shorts.

Figure 1:
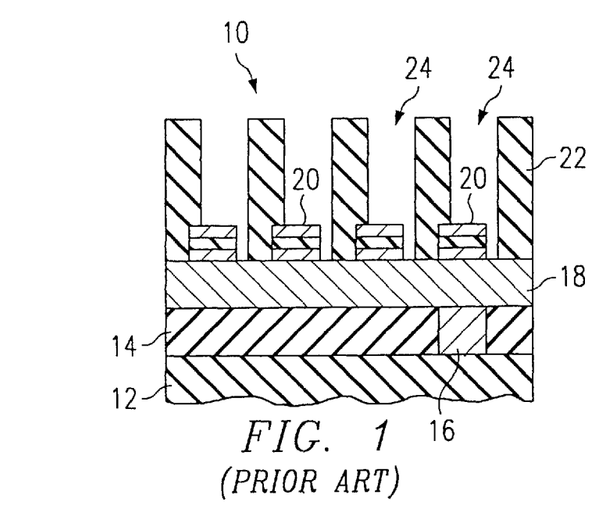
FIGS. 1 and 2 illustrate cross-sectional views of a prior art MRAM IC having copper conductive lines formed by a damascene process.
Figure 2:
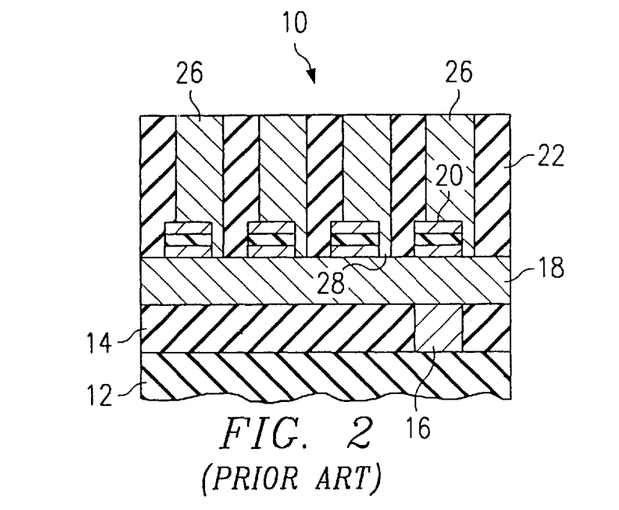

An example of a level-to-level electrical short is shown in the prior art figures of FIG. 1 and FIG. 2. A prior art MRAM device 10 having perpendicular conductive lines 18 and 26 comprised of copper is shown. A workpiece 12 is provided, typically comprising silicon oxide over silicon single-crystal silicon, for example. The workpiece 12 may include other conductive layers or other semiconductor elements, e.g., transistors, diodes, etc. Compound semiconductors such as GaAs, InP, Si/Ge, and SiC may be used in place of silicon, for example.

A first inter-level dielectric layer 14 is deposited over the workpiece 12. The inter-level dielectric 14 may comprise silicon dioxide, for example. The inter-level dielectric layer 14 is patterned, for example, for vias 16, and etched. Vias 16 are then formed, which may comprise copper, tungsten for other metals, for example.

An M2 metallization layer 18 is formed next. In prior art MRAMs 10, the M2 layer 18 comprises copper, which is desirable for its superior conductivity and the ability to use smaller conductive lines because of the improved conductivity of the copper. Because copper cannot be etched, a damascene process is used to form the conductive lines. The same dielectric 14, is patterned and etched, and the trenches are filled with the copper 18 fill to form conductive lines 18 in M2 layer.

Next, a magnetic stack 20 is formed over copper lines 18. Magnetic stack 20 typically comprises a first magnetic layer comprised of a plurality of layers of materials such as PtMn, CoFe, Ru, and NiFe, for example. Magnetic stack 20 also includes a dielectric layer, comprising $Al_2O_3$, for example, deposited over the first magnetic layer, and a second magnetic layer comprises a similar multi-layer structure using similar materials as the first magnetic layer. The first magnetic layer, dielectric layer and second magnetic layer are patterned to form magnetic stacks 20.

Conductive lines 26 within a M3 layer, for example, are formed over magnetic stacks 20. Because conductive lines 26 comprise copper in the prior art structure 10 shown, again, a damascene process is used. A dielectric layer 22 is deposited over magnetic stacks 20 and conductive line 18. Dielectric layer 22 is patterned and etched with trenches that will be filled with copper to form conductive lines 26, as shown in FIG. 2.

A problem with using a damascene process to form copper conductive lines 18 and 26 disposed about magnetic stack 20, is a misalignment that can occur generally at 28 (to the left or right) and 20 (in and out of the paper), causing a short between M2 conductive lines 18 and the M3 conductive lines 26. Any misalignment in the damascene process can cause the M3 copper conductive lines 26 to be misaligned, rather than being disposed directly over a magnetic stacks 20 as intended, and to contact M2 conductive lines 18, as shown. A short such as the one shown at 28 in FIG. 2 renders the MRAM device 10 inoperable. Line-to-line shorts, not shown, may also occur in prior art damascene processes.

Another problem with using copper for conductive lines 18 and 26 is the requirement of using several copper cap layers to prevent oxidation, and copper seed layers for the proper fill of the copper material (not shown).

Another problem with fabricating MRAMs is that the spacing between the metallization layers 18 and 20 is small, e.g. 500 Angstroms, making alignment critical. For other semiconductor devices, the spacing between metallization layers is several thousand Angstroms, e.g. 2000 to 8000 Angstroms. In an MPAM, the metallization layers must be closely coupled to the magnetic stack so the conductive lead current is in close enough proximity to the magnet sufficient to switch the magnet.

Copper damascene conductive lines have been used in MRAM BEOL because of the high conductivity and low resistivity of copper. Because aluminum has a higher sheet resistance than copper, it has not been considered in the past to be a viable option for use in conductive lines of MRAMs. However, recently developed alumunimum technology is capable of processing 0.15 $\mu$m and smaller aluminum lines with an aspect ratio of 2.5 or higher. These technologies provide aluminum with a sheet resistance low enough for an MRAM application, in accordance with the present invention, to be described further herein.

The present invention comprises a process flow that integrates magnetic cross-point devices in an aluminum BEOL without requiring additional lithographic steps. An embodiment of the present invention is shown in the cross-sectional view in FIGS. 3a and 3b through FIGS. 10a and 10b.

Figure 3A:
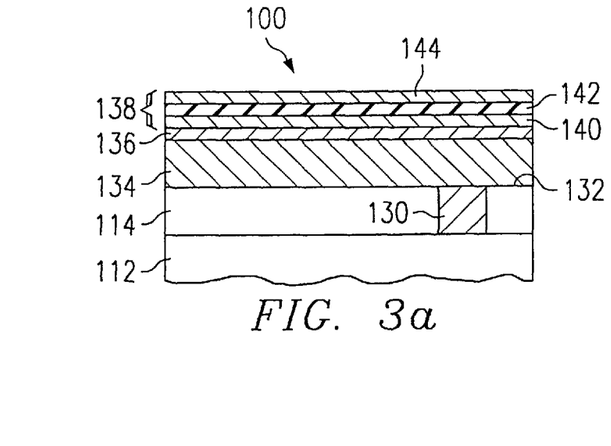
Figure 3B:
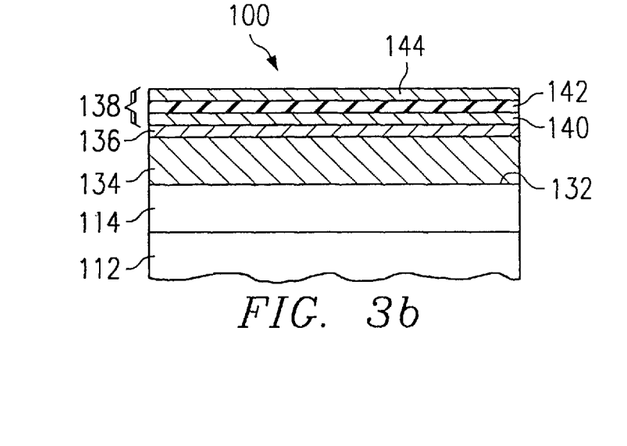

A workpiece 112 is provided, typically comprising silicon oxide over single-crystal silicon, shown in FIGS. 3a and 3b. The workpiece 112 may include other conductive layers or other semiconductor elements, e.g., transistors, diodes, etc. Compound semiconductors such as GaAs, InP, Si/Ge, and SiC may be used in place of silicon, as examples. In the following description, workpiece 112 is only shown in FIGS. 3a and 3b, but is to be understood to reside beneath the inter-level dielectric 114 in subsequent figures.

An inter-level dielectric layer 114 is deposited over the workpiece 112. Inter-level dielectric layer 114 may comprise silicon oxide, and may also comprise a low dielectric constant material or other dielectric materials, for example. Examples of other suitable dielectrics include Silk™, fluorinated silicon glass, and FOX™, for example. Inter-level dielectric layer 114 is patterned and etched.

Vias 130 are formed in inter-level dielectric layer 114. Via 130 may comprise aluminum or tungsten, or other metals, for example. Vias 130 may comprise a first metallization layer or M1 layer, for example. A CMP process is performed to remove the excessive metal leaving only the metal inside the vias. An optional barrier layer 132 may be deposited over inter-level dielectric layer 114 and via 130. Preferably, barrier layer 132 comprises a nitride such as TiN, and alternatively, barrier layer 132 may comprise Ti, for example.

A second metallization layer 134 such as an M2 layer comprising aluminum is deposited over barrier layer 132 (or inter-level dielectric layer 114, if a barrier layer 132 is not used). M2 layer 134 preferably comprises aluminum copper, for example comprising 99.5% of aluminum and 0.5% of copper by weight. Preferably, M2 layer 134 comprises a standard aluminum material that is used in semiconductor aluminum technology for logic and DRAMs, for example. The second metallization layer 134 may be deposited by physical vapor deposition (PVD), for example. Second metallization layer 134 may be, for example, 2000 to 5000 Angstroms thick.

An optional cap layer 136 may be deposited over M2 layer 134. Cap layer 136 preferably comprises a nitride, such as TiN, and may alternatively comprise Ti, as examples. However, cap layer 136 is not required because the magnetic stack 138 functions as an anti-reflective coating.

Next, a magnetic stack 138 is formed over M2 layer 134 and cap layer 136. First, a bottom metal stack 140, often referred to in the art as a hard layer, is deposited over cap layer 136. Bottom metal stack 140 preferably comprises a plurality of metal layers, comprising PtMn, CoFe, Ru, and NiFe, for example, although other types of suitable magnetic materials and metal layers may be used. Four to eight layers are typically used for the bottom metal stack 140. Various techniques such as physical vapor deposition (PVD), ion beam sputtering, evaporation, and chemical vapor deposition (CVD) may be used to deposit the magnetic layers of bottom metal stack 140. Because each layer is very thin, e.g. most of them <100 Angstroms, preferably, the layers are deposited by PVD. Preferably, bottom metal layer 140 is between 200 and 400 Angstroms thick.

Magnetic stack 138 also comprises a thin dielectric layer 142, often referred to as a tunnel layer, deposited over bottom metal stack 140. Thin dielectric layer 142 preferably may comprise, for example, aluminum oxide ($Al_2O_3$), and is preferably 10–15 Angstroms thick.

Magnetic stack 138 also comprises a top metal layer 144, often referred to as a soft layer, deposited over insulating layer 142. Top metal layer 144 comprises a plurality of magnetic layers, for example, and may comprise similar materials deposited using similar processes as are used to form bottom metal layer 140. The total thickness of magnetic stack 138 may be, for example, 500 Angstroms.

Figure 4A:
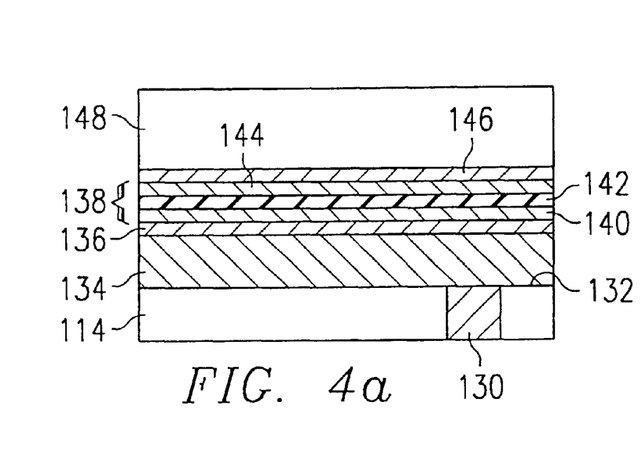
Figure 4B:
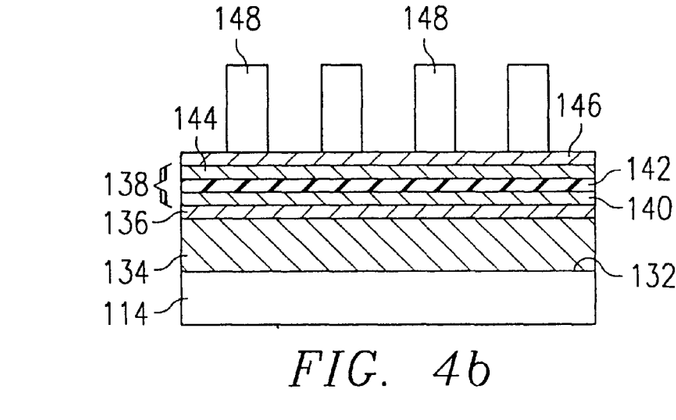

A photoresist 148, typically comprising an organic polymer, for example, is deposited over the magnetic stack 138, as shown in FIGS. 4a and 4b. An optional hard mask 146 comprising TaN, for example, and alternatively comprising Ta, TiN, W, Si, WSi, or a metal used in the magnetic stack 138, as examples, may be deposited over magnetic stack 138 prior to the deposition of the photoresist 148, as shown. The hard mask 146 is thin, e.g. 10–40 nm and may be deposited by PVD or plasma enhanced CVD, as examples.

A lithographic M2 pattern is made on the wafer surface. The photoresist 148 is exposed, preferably using a lithography mask, for example, to create the pattern desired for the first conductive lines in the M2 134 layer, as shown in FIG. 4b. Exposed portions of the photoresist 148 are removed, if a positive resist is used. Preferably, the lithographic pattern is transferred to the metal hard mask level by reactive ion etching (RIE), ion milling or wet chemical etch. The M2 metallization layer 134 is RIE'd using a resist or metal hard mask. The resist is stripped and cleaned of the pattern.

Figure 5A:
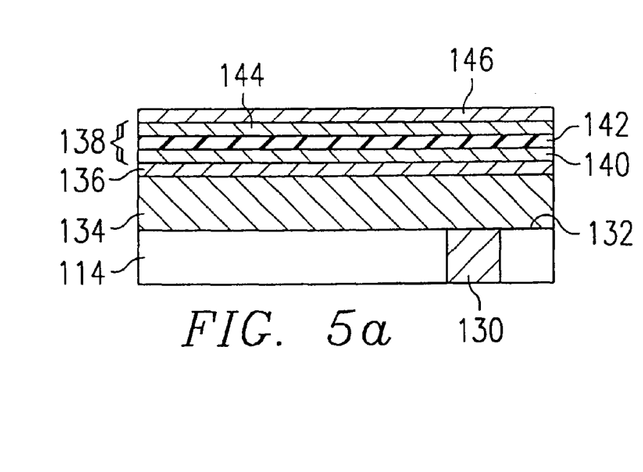
Figure 5B:
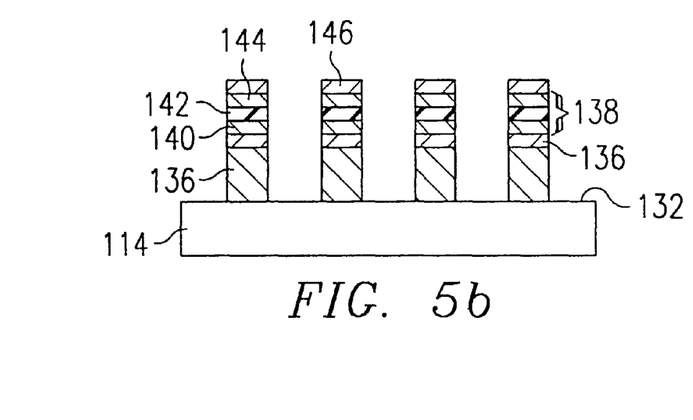

Exposed portions of magnetic stack 138 are etched, and exposed portions of cap layer 136 and M2 layer 134 are etched. Barrier layer 132 is etched to leave the structure shown in FIGS. 5a and 5b. Because FIG. 5a shows an orthogonal or perpendicular view compared to the view shown in FIG. 5b, a side view of a conductive line 134 is visible in FIG. 5a, whereas a plurality of conductive lines 134 is visible in FIG. 5b. Magnetic stack 138 material remains over each conductive line 134, as shown in FIGS. 5a and 5b. First conductive lines 134 preferably run in a first direction and serve as bitlines or wordlines of the MRAM memory array.

Figure 6A:
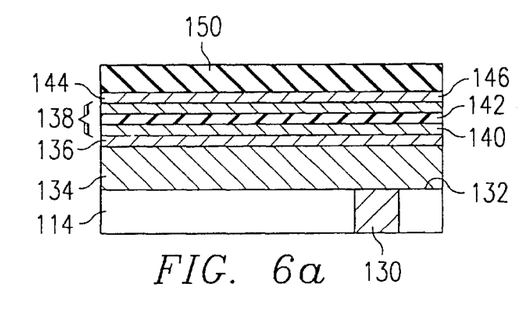
Figure 6B:
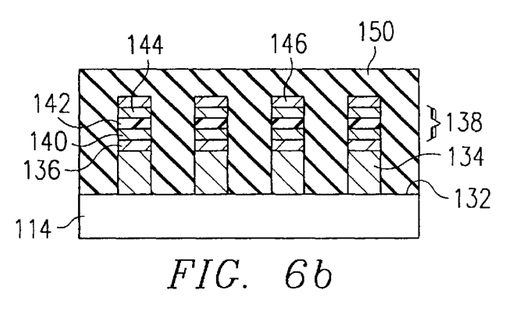
Figure 7A:
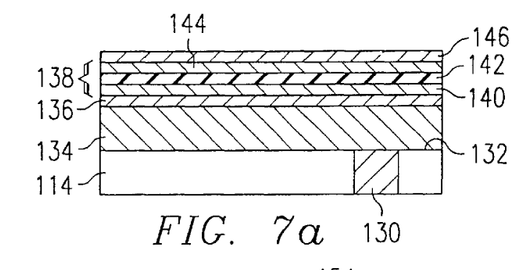
Figure 7B:
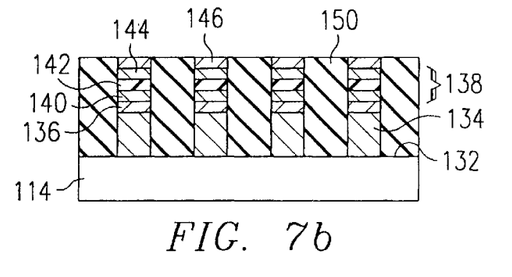

A second inter-level dielectric 150 is deposited over conductive lines 134 and magnetic stack 138, shown in FIGS. 6a and 6b. Hard mask 146 may be removed from the top of the magnetic stack 138 prior to the deposition of the second inter-level dielectric 150, or alternatively, hard mask 146 may be left intact as shown in FIGS. 6a and 6b. The second inter-level dielectric 150 fills the gaps between the conductive liens 134 and magnetic stack lines 138. Preferably the second interlevel dielectric 150 is deposited by PECVD, high-density plasma deposition, spin-on or printing. Densification of the inter-level dielectric 150 is performed, if required. The second inter-level dielectric 150 is subjected to a CMP process to remove portions of the inter-level dielectric 150 from the tops of magnetic stack 138 and optional hard mask 146. The CMP process stops at hard mask 146 if used.

Next, conductive lines 152 are formed that are perpendicular to conductive lines 134, shown in FIGS. 8a, 8b, 9a and 9b. Alternatively, if a multi-level magnetic device may be constructed, by depositing another magnetic stack layer (not shown) over second inter-level dielectric 150.

Second conductive lines 152 preferably run in a second direction orthogonal to the first direction, and serve as bitlines or wordlines of the MRAM memory array.

Figure 8A:
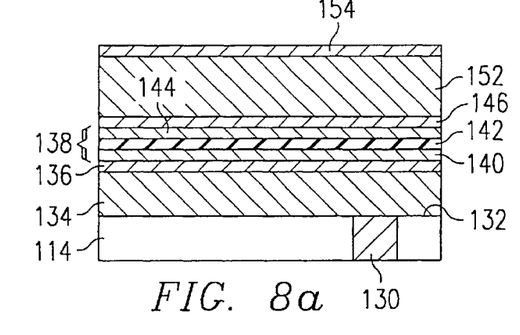
Figure 8B:
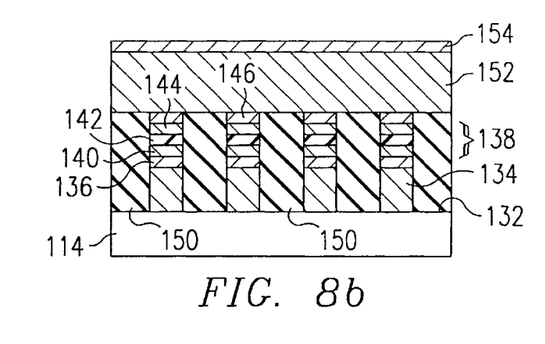

To form conductive lines 152, an aluminum layer is deposited over magnetic stack 138 and optional hard mask 146, as shown in FIGS. 8a and 8b. A cap layer 154 comprising a nitride such as TiN, for example, may be deposited over the aluminum layer. Preferably aluminum layer 152 comprises an M3 metallization layer although the present MRAM may be formed in other metallization layers than the M2 and M3 layers described herein. The M3 metallization layer 152 may be, for example, 2000 to 5000 Angstroms thick.

Figure 9A:
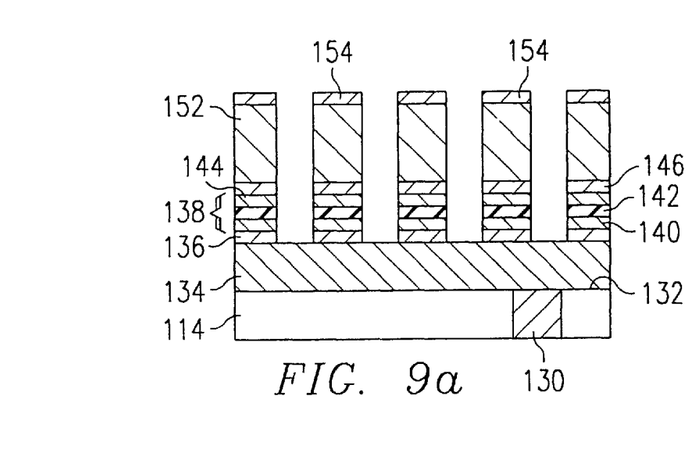
Figure 9B:
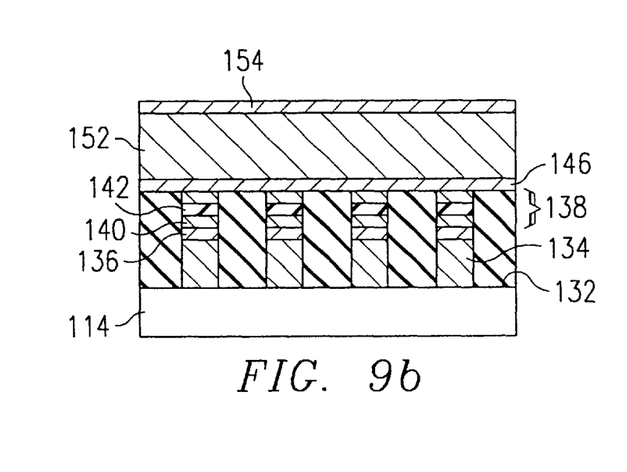

M3 metallization layer 152 is lithographically patterned using a photoresist, not shown. M3 layer 152 and optional cap layer 154 are etched to form conductive lines 152, as shown in FIGS. 9a and 9b. Portions of magnetic stack 138 beneath etched-away portions of M3 layer 152 are also etched, observable in FIG. 9a. Note that portions of magnetic stack 138 reside only on top of conductive lines 134 in FIG. 9b, and portions of magnetic stack 138 reside only on the bottom of conductive lines 152 in FIG. 9a. Because the magnetic stack 138 is patterned and etched simultaneously with etching the conductive lines 134 and 152, the magnetic stack 138 formation is self-aligned, preventing level-to-level shorts found in the prior art.

Figure 10A:
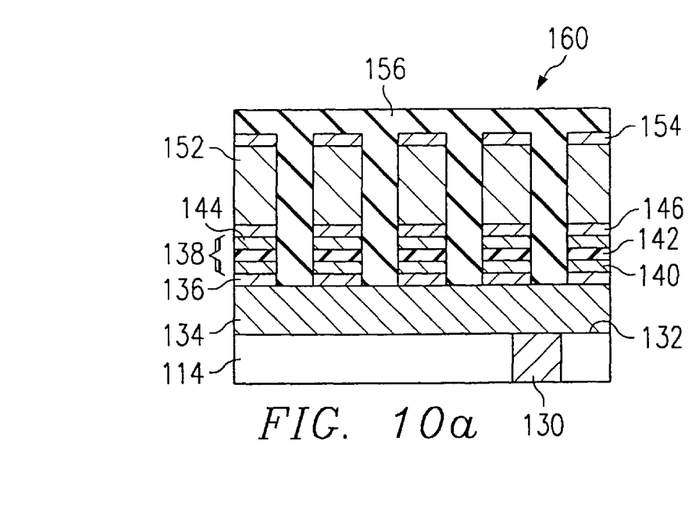
Figure 10B:
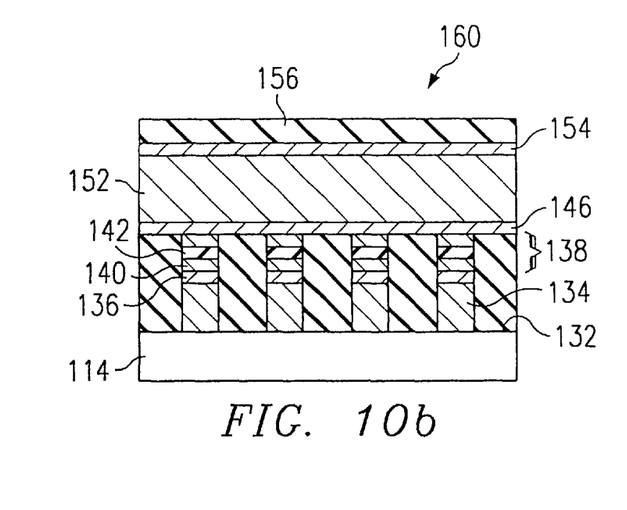
Figure 11:
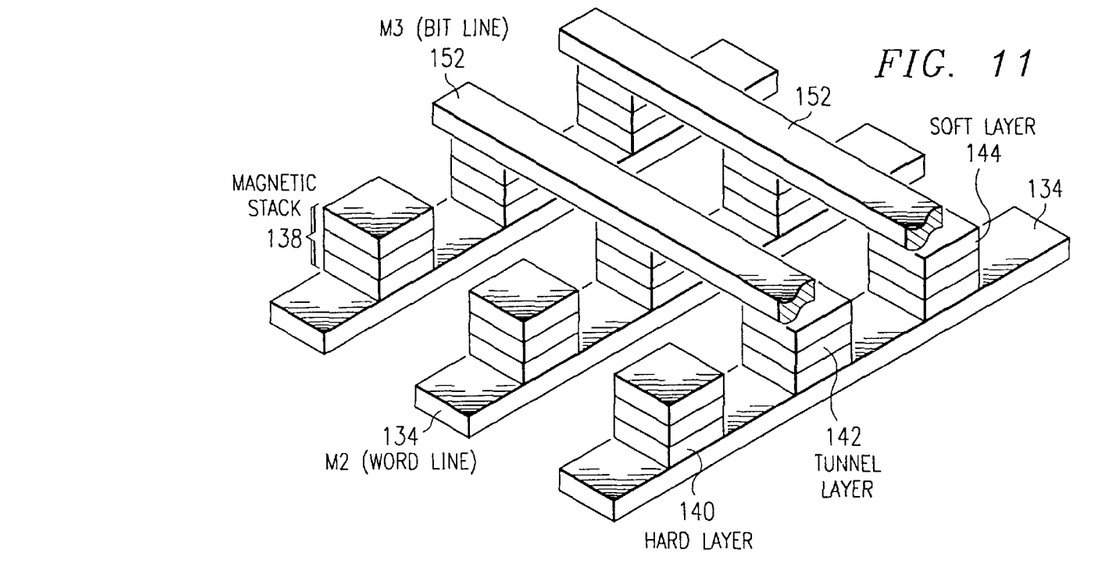
FIG. 11 is a perspective view of the present MRAM structure.

A third inter-level dielectric 156 may be deposited over conductive lines 152, cap layer 154, and magnetic stacks 138, as shown in FIGS. 10a and 10b. Subsequent processing steps are then performed. The completed MRAM structure in accordance with the present invention is shown generally at 160 in FIGS. 10a and 10b, and a perspective view is shown in FIG. 11.

Figure 12A:
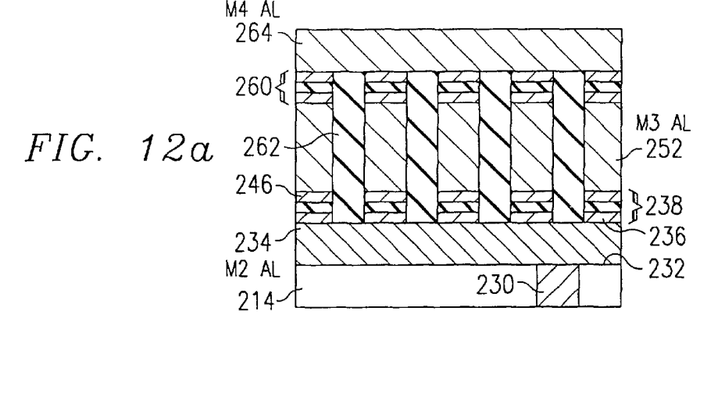
FIGS. 12a, 12b, 13a and 13b show a multi-level MRAM device in accordance with an embodiment of the present invention.
Figure 12B:
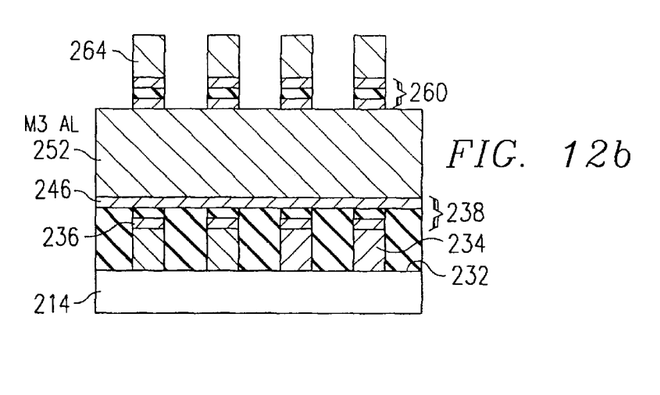

In an embodiment of the present invention, a multi-level magnetic MRAM device can be achieved, shown in FIGS. 12a, 12b, 13a and 13b. The same process is followed as described for FIGS. 3a and 3b through FIGS. 8a and 8b. Referring to FIGS. 12a and 12b, a second magnetic stack 260 is deposited over conductive lines 252 and cap layer 254. A lithography pattern and RIE is performed to form the pattern in the second magnetic stack 260, M3 aluminum layer 252, and the first magnetic stack 238. An ILD 262 is deposited to fill the gaps between the stacks 238/260 and conductive lines 252. The ILD is CMP'd to planarize the ILD 262 surface and expose the tops of the second magnetic stacks 260.

Figure 13A:
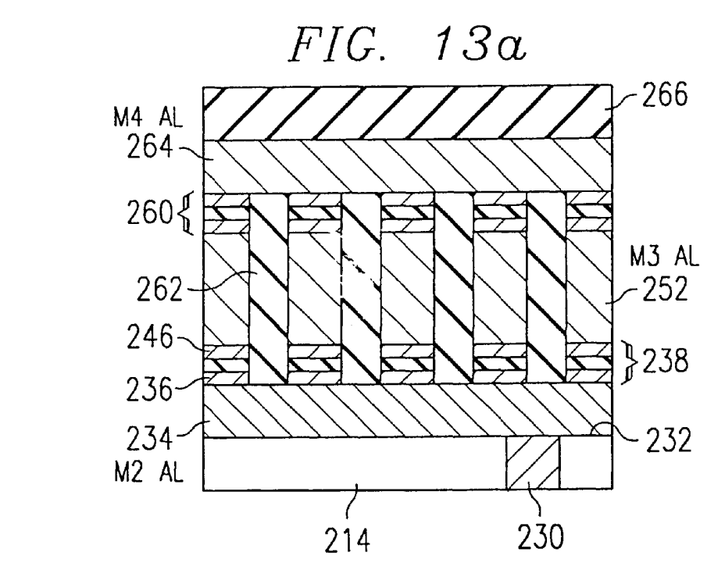
Figure 13B:
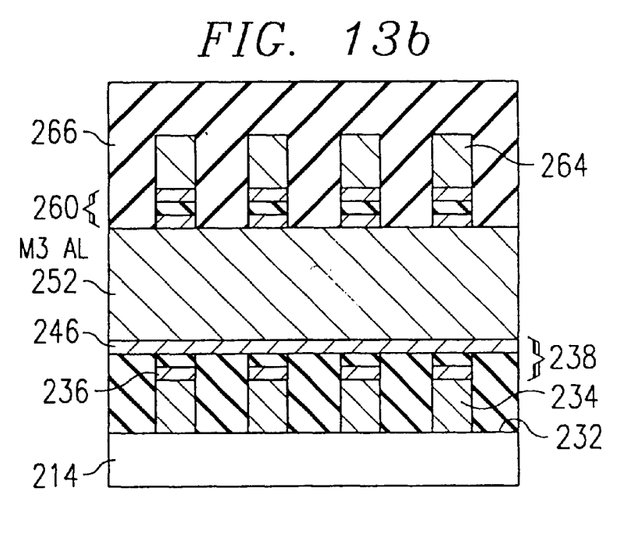

A conductive material 264, comprising, for example, an M4 aluminum layer, is deposited over the ILD 262. A lithography pattern and RIE is performed to form the pattern in the M4 conductive layer 264 and the second magnetic stack 260. A dielectric material 266 is deposited over the patterned conductive lines 264 and the second magnetic stack 260, as shown in FIGS. 13a and 13b. A plurality of additional magnetic stacks may be fabricated between metallization layers, by repeating the manufacturing process described herein.

The present invention achieves technical advantages by providing an MRAM device 160 and manufacturing process thereof having conductive lines 134 and 152 that are comprised of aluminum and which may be etched directly, rather than requiring a damascene process. This allows for improved alignment of the conductive lines 134/152 over conductive stacks 138, preventing line-to-line or level-to-level electrical shorts. In accordance with the present invention, aluminum is used in an MRAM for metallization layers, which is advantageous because fewer processes, cap layers and seed layers are required than with copper metallization layers, for example.

Advantages of the invention include providing a process flow for integrating magnetic cross-point devices in an aluminum BEOL with no additional lithographic steps or masks required to fabricate the magnetic device. The process is self-aligning, which prevents shorts between metallization layers. No additional lithographic masks are needed for MRAM fabrication in accordance with the present invention. The use of copper as metallization layers is avoided with the present invention, so that damascene processes are not required. Aluminum can be etched directly, unlike copper which is unetchable. Thus, the formation of conductive lines 134/152 is simplified and requires fewer processing steps. The magnetic metal stack 138 functions as an anti-reflective coating for aluminum metallization layer 150. Optional metal hard mask 146 may be used for magnetic stack 138 and aluminum metallization layer 134 RIE. Optional metal hard mask 146 also functions as an M2 dielectric 156 CMP stop layer.

What is claimed is:

1. A method of manufacturing a magnetic random access memory (MRAM) device, comprising:
   providing a workpiece;
   depositing a first metallization layer over the workpiece;
   depositing a first magnetic stack over the first metallization layer;
   patterning and etching the first magnetic stack and first metallization layer to form first conductive lines;
   depositing a first dielectric layer over the first conductive lines;
   depositing a second metallization layer over the first conductive lines and first dielectric layer; and
   patterning and etching the second metallization layer and the first magnetic stack to form second conductive lines orthogonal to the first conductive lines, and leave portions of the first magnetic stack between cross-points of the first and second conductive lines.

2. The method according to claim 1 wherein depositing a first and second metallization layer comprise depositing aluminum.

3. The method according to claim 1 further comprising depositing a second dielectric layer over the workpiece, wherein depositing a first metallization layer comprises depositing a first metallization layer over the second dielectric layer.

4. The method according to claim 1, further comprising depositing a barrier layer over the second dielectric layer.

5. The method according to claim 1 further comprising depositing a first cap layer over the first metallization layer.

6. The method according to claim 5 further comprising depositing a second cap layer over the second metallization layer.

7. The method according to claim 1 further comprising depositing a third dielectric layer over the second conductive lines.

8. The method according to claim 1 wherein the first magnetic stack is adapted to function as an anti-reflective coating for the second metallization layer.

9. The method according to claim 1 further comprising depositing a hard mask over the first magnetic stack.

10. The method according to claim 1 further comprising:
   depositing a second magnetic stack over the second metallization layer after depositing the second metallization layer, wherein patterning and etching the second metallization layer and the first magnetic stack also comprises patterning and etching the second magnetic stack;
   depositing a second dielectric layer over the second conductive lines and second magnetic stack;
   depositing a third metallization layer over the second magnetic stack; and
   patterning and etching the second magnetic stack and second metallization layer to form third conductive lines orthogonal to the second conductive lines, and leave portions of the second magnetic stack between cross-points of the second and third conductive lines.

11. The method according to claim 10 further comprising:
   depositing a third magnetic stack over the third metallization layer after depositing the third metallization layer, wherein patterning and etching the third metallization layer and the second magnetic stack also comprises patterning and etching the third magnetic stack;
   depositing a third dielectric layer over the third conductive lines and third magnetic stack;
   depositing a fourth metallization layer over the third magnetic stack; and
   patterning and etching the third magnetic stack and third metallization layer to form fourth conductive lines orthogonal to the third conductive lines, and leave portions of the third magnetic stack between cross-points of the third and fourth conductive lines.

* * * * *